United States Patent
Ding et al.

(10) Patent No.: US 7,063,800 B2
(45) Date of Patent: Jun. 20, 2006

(54) METHODS OF CLEANING COPPER SURFACES IN THE MANUFACTURE OF PRINTED CIRCUIT BOARDS

(76) Inventors: Ying Ding, 67 Sylvan Crest Dr., Southbury, CT (US) 06488; Ronald N. Redline, 28 Platt Dr., Prospect, CT (US) 06712; Richard C. Retallick, 22 Stoner Dr., West Hartford, CT (US) 06107; Mark Wojtaszek, 15 Rockledge La., Canton, CT (US) 06019

( * ) Notice: Subject to any disclaimer, the term of this patent is extended or adjusted under 35 U.S.C. 154(b) by 106 days.

(21) Appl. No.: 10/705,026

(22) Filed: Nov. 10, 2003

(65) Prior Publication Data

US 2005/0098538 A1    May 12, 2005

(51) Int. Cl.
*C03C 15/00*    (2006.01)

(52) U.S. Cl. .................... 216/90; 216/103; 216/105; 216/106

(58) Field of Classification Search ............... 216/83, 216/90, 100, 103, 105, 106
See application file for complete search history.

(56) References Cited

U.S. PATENT DOCUMENTS

| | | | |
|---|---|---|---|
| 4,401,509 A * | 8/1983 | Schellinger, Jr. ............ 216/106 |
| 4,619,741 A | 10/1986 | Minten et al. |
| 4,622,107 A | 11/1986 | Piano |
| 4,622,108 A | 11/1986 | Polakovic et al. |
| 4,631,117 A | 12/1986 | Minten et al. |
| 4,684,560 A | 8/1987 | Minten et al. |
| 4,718,993 A | 1/1988 | Cupta et al. |
| 4,724,005 A | 2/1988 | Minten et al. |
| 4,874,477 A | 10/1989 | Pendleton |
| 4,897,164 A | 1/1990 | Piano et al. |
| 4,964,959 A | 10/1990 | Nelsen et al. |
| 4,994,153 A | 2/1991 | Piano et al. |
| 5,015,339 A | 5/1991 | Pendleton |
| 5,106,537 A | 4/1992 | Nelsen et al. |
| 5,110,355 A | 5/1992 | Pendleton |
| 5,139,642 A | 8/1992 | Randolph et al. |
| 5,143,592 A | 9/1992 | Toro |
| 6,417,147 B1 | 7/2002 | Amemiya et al. |
| 6,426,020 B1 * | 7/2002 | Okada et al. ............... 252/79.1 |
| 6,579,153 B1 * | 6/2003 | Uchikura et al. ............. 451/41 |
| 6,710,259 B1 * | 3/2004 | Thorn et al. ................ 174/257 |
| 6,780,784 B1 * | 8/2004 | Jo et al. ..................... 438/745 |
| 2002/0081847 A1 | 6/2002 | Jo et al. |
| 2003/0180377 A1 | 9/2003 | Ramirez et al. |
| 2005/0067378 A1 * | 3/2005 | Fuerhaupter et al. ......... 216/34 |

OTHER PUBLICATIONS

Material Safety Data Sheet, Solutia Inc., Jan. 19, 2001, Dequest® Deflocculant & Sequestrant.
Product Information, Borchers GmbH, Dec. 12, 2002, Bayowet® FT248 liquid (50%).

* cited by examiner

*Primary Examiner*—Nadine G. Norton
*Assistant Examiner*—Binh X. Tran
(74) *Attorney, Agent, or Firm*—Carmody & Torrance LLP

(57) ABSTRACT

The present invention sets forth an improved method of microetching a metal substrate by contacting the substrate with an aqueous composition comprising a sodium persulfate or hydrogen peroxide oxidizing agent, acid, and one or more additives. When the oxidizing agent is sodium persulfate, the one or more additives generally comprise an aliphatic saturated dicarboxylic acid. When the oxidizing agent is hydrogen peroxide, the one or more additives generally comprise a stabilizer and amino tris(methylene phosphonic acid).

13 Claims, No Drawings

METHODS OF CLEANING COPPER SURFACES IN THE MANUFACTURE OF PRINTED CIRCUIT BOARDS

FIELD OF THE INVENTION

The invention relates to improved methods of cleaning metal surfaces during the production of printed circuit boards.

BACKGROUND OF THE INVENTION

Printed wiring boards (also known as printed circuit boards or PWB's) are generally laminated materials comprised of two or more plates or foils of copper, which are separated from each other by a layer of nonconducting material. Although copper is generally used as the electroplating metal in printed wiring boards, those skilled in the art will recognize that other metals such as nickel, gold, palladium, silver and the like can also be electroplated. The nonconducting layer or layers are preferably an organic material such as an epoxy resin impregnated with glass fibers, but may also comprise thermosetting resins, thermoplastic resins, and mixtures thereof, with or without reinforcing materials such as fiberglass and fillers.

In many printed wiring board designs, the electrical pathway or pattern requires a connection between the separated copper plates at certain points in the pattern. This is usually accomplished by drilling holes at the desired locations through the laminate of copper plates and the nonconducting layer and then connecting the separate metal plates. Subsequently, the through hole walls of the printed wiring board are prepared for electroplating. These plated through hole walls are necessary to achieve connections between two metal circuit patterns on each side of a printed wiring board, or in addition to this, between the inner layer circuit patterns of a multilayer board.

One advantageous way of preparing the through hole walls for electroplating utilizes a liquid carbon dispersion. The steps of this process are discussed briefly below.

First, surfaces of through holes are made relatively smooth for plating. Then, the printed wiring board is preferably subjected to a precleaning process in order to place the printed wiring board in condition for receiving a liquid carbon black dispersion. After the application of the cleaner, the PWB is rinsed in water to remove excess cleaner from the board and then contacted with a conditioner solution. The conditioner solution is used to ensure that substantially all of the hole wall glass/epoxy surfaces are properly prepared to accept a continuous layer of the subsequent carbon black particles. See for example U.S. Pat. No. 4,634,691, to Lindsey, the subject matter of which is herein incorporate by reference in its entirety, which describes a suitable conditioner solution.

The liquid carbon black dispersion is next applied to or contacted with the conditioned PWB. This dispersion contains three critical ingredients, namely, carbon black, one or more surfactants capable of dispersing the carbon black and a liquid dispersing medium such as water.

The carbon black-covered board is then subjected to a step where substantially all (i.e., more than about 95% by weight) of the water in the applied dispersion is removed and a dried deposit containing carbon black is left in the holes and on other exposed surfaces of the nonconducting layer. To insure complete coverage of the hole walls, the procedure of immersing the board in the liquid carbon black dispersion and then drying may be repeated.

The carbon black covered board may optionally next be subjected to an additional graphite treatment yielding the deposition of a graphite layer on top of the carbon layer. Preferably, the carbon black-coated PWB board is first contacted with a conditioner solution, which is used to promote subsequent adsorption of the dispersed graphite particles on the carbon black layer. After the application of this optional conditioner solution, the PWB is subsequently rinsed with water to remove excess conditioner from the board.

The board may optionally next be contacted with the liquid graphite dispersion or suspension. This graphite dispersion contains three critical ingredients; namely, graphite, one or more surfactants capable of dispersing the graphite, and a liquid dispersing medium such as water. The board is then subjected to a step where substantially all (i.e., more than about 95% by weight) of the water in the applied dispersion is removed and a dried graphite deposit is left in the holes over the carbon black deposit and on other exposed surfaces of the nonconducting layer. To ensure sufficient coverage of the hole walls, the procedure of immersing the board in the liquid graphite dispersion and then drying may be repeated.

The steps of this process are described in more detail, for example, in U.S. Pat. No. 4,619,741, the subject matter of which is herein incorporated by reference in its entirety. Various modifications and refinements to this process are set forth in U.S. Pat. Nos. 4,622,107, 4,622,108, 4,631,117, 4,684,560, 4,718,993, 4,724,005, 4,874,477, 4,897,164, 4,964,959, 4,994,153, 5,015,339, 5,106,537, 5,110,355, 5,139,642, and 5,143,592, the subject matter of each of which is herein incorporated by reference in its entirety.

The carbon black and graphite dispersions on the PWB not only coat the drilled hole surfaces, which is desirable, but also entirely coat the copper plate or foil surfaces, which is undesirable. Thus, prior to many subsequent operations, all carbon black and graphite must be removed from the copper plate and/or foil surfaces.

The removal of the carbon black and/or graphite, specifically from the copper surfaces including, especially, the rims of the drilled holes while leaving the coating intact on the glass fibers and epoxy surface of the hole walls, may preferably be achieved by the employment of a mechanically scrubbing operation or a microetch or both. The microetch is preferred because of ease of use.

After the microetch step and a subsequent water rinse, the PWB may either proceed to the photoimaging process and later be electroplated or be directly panel electroplated. The PWB may be further cleaned with a citric acid or benzotriazole anti-tarnish solution or another acid cleaner solution or both after the above microetch step. The thus treated printed wiring board is then ready for electroplating operation which includes immersing the PWB in a suitable electroplating bath for applying a copper coating on the hole walls of the nonconducting layer.

Microetch solutions used to remove excess graphite and/or carbon black may be based on hydrogen peroxide or sodium persulfate as the oxidizing agent. For example, a sodium persulfate-based product may be combined with sufficient sulfuric acid to make a microetch bath containing 100–300 grams of sodium persulfate per liter of deionized water and about 1 to 10% by weight sulfuric acid.

In the case of a multilayer type board, this microetching step is especially preferred. Since, after the drying step, not only will the outer copper plate or foil be coated with carbon black but also the copper inner plates or foils exposed within the holes. Thus, the microetch procedure performs two very desirable tasks at once:

A. It removes substantially all excess carbon black and/or graphite material adhering to the outer copper plates or foils and the exposed surfaces of copper inner plates or foils in a multilayer PWB; and B. It chemically cleans and microetches slightly the outer copper surfaces, thereby making them good bases for either dry film application or the electrolytic deposition of copper when followed by mechanically scrubbing the PWB.

The mechanism by which this microetch works is by not attacking the carbon black material or the graphite material deposited on the copper foil directly, but rather to attack exclusively the first few atomic layers of copper directly below which provides the adhesion for the coating. Hence, the fully coated board is immersed in the microetch solution to "flake" off the carbon black and/or the graphite from the copper surfaces in the form of micro-flakelets. These micro-flakelets are removed from the microetch bath either by filtration through a pump or via a weir type filter arrangement commonly used in the PWB industry. The liquid carbon black dispersion, the liquid graphite dispersion, the microetch treatment, and the intermittent water rinses are preferably carried out by immersing the PWB in baths constructed of polypropylene or polyvinyl chloride (PVC) and kept agitated by a recirculation pump or pumped in air or by a conveyorized flood or spray machine.

These microetches have been widely used to clean carbon off copper surfaces after the application of the carbon and graphite dispersions. The etch is typically controlled at about 40 microinches, however a lower etch is desired for a variety of reasons, including the elimination of voids caused by nailheads, the reduction of negative etchback, etc.

Traditionally, the etch of the copper surface is lowered by employing one of more of the following methods: 1) less oxidant, 2) lowering the temperature of the microetching solution, and/or 3) shorter contact time. The drawback to the use of these methods is that they contribute to a less clean copper surface, thereby increasing the number of defects due to carbon residues.

Various additives for the microetching solution have been suggested to suppress the etch without hurting the cleaning capability of the microetching solution. One additive that has been used previously is citric acid. However, citric acid can leave a film on the copper surface, which can cause dry film lock (ie. inability to develop) and poor copper/copper adhesion. In addition, since citric acid is a chelator, waste treatment and disposal can be troublesome.

Thus there remains a need in the art for an additive that can suppress the etch on the surface without affecting the cleaning capability of the microetching solution.

SUMMARY OF THE INVENTION

The inventors have surprisingly discovered that an aliphatic saturated dicarboxylic acid, especially glutaric acid, can be added to a sodium persulfate-based microetching solution to increase the cleaning capability of the solution without leaving a film on the treated copper surface and without the environmental concerns of the additives of the prior art. Furthermore, the improved microetchant of the invention advantageously reduces the etch on the copper surfaces.

In the case of hydrogen peroxide-based microetching solutions, the inventors have surprisingly discovered that the addition of amino tris(methylene phosphonic acid) can advantageously be used to lower the etch without affecting the cleaning capability of the solution.

The present invention sets forth a composition and method of microetching and/or cleaning carbon from a metal substrate by contacting the substrate with an aqueous composition comprising:
a) an oxidizing agent selected from the group consisting of sodium persulfate and hydrogen peroxide;
b) acid, preferably inorganic acid such as sulfuric acid; and
c) one or more additives;
wherein when the oxidizing agent is sodium persulfate, the one or more additives comprises an aliphatic saturated dicarboxylic acid; and
wherein when the oxidizing agent is hydrogen peroxide, the one or more additives comprise amino tris (methylene phosphonic acid).

The present invention also describes a composition for improving dry film adhesion to a printed wiring board comprising:
a) hydrogen peroxide;
b) acid, preferably inorganic acid such as sulfuric acid;
b) an effective amount of amino tris(methylene phosphonic acid); and
c) optionally but preferably, an effective amount of perfluoroctane sulfoneacide tetraethyl ammonium salt.

In another embodiment, the present invention describes an aqueous composition for microetching and/or cleaning carbon from surfaces of through holes or vias comprising:
a) hydrogen peroxide;
b) acid, preferably inorganic acid such as sulfuric acid; and
c) an effective amount of perfluoroctane sulfoneacide tetraethyl ammonium salt.

DETAILED DESCRIPTION OF THE PREFERRED EMBODIMENTS OF THE INVENTION

The present invention relates to improved microetching solutions particularly useful for cleaning carbon deposits from metal surfaces in the production of printed wiring boards.

Microetching solutions are traditionally built around an oxidant, which is generally either sodium persulfate or hydrogen peroxide. Microetching solutions generally comprise the oxidizing agent (hydrogen peroxide or sodium persulfate), acid (preferably inorganic acid such as sulfuric acid), and one or more additives.

In the case of sodium persulfate-based microetchants, the composition generally comprises sodium persulfate, and acid (preferably inorganic acid such as sulfuric acid) in aqueous solution. Sodium persulfate is generally present in the solution at a concentration of 50–250 grams/liter, preferably about 120 grams/liter. Sulfuric acid is preferably present in the solution at a concentration of 0.5 to 4 percent, preferably about 1 to 2 percent.

An aliphatic dicarboxylic acid (preferably saturated) is added to the microetching solution to enhance the cleaning capability of the solution. The aliphatic saturated dicarboxylic acid is preferably selected from the group consisting of malonic acid, succinic acid, and glutaric acid, although glutaric acid is especially preferred.

It is generally desired that the etch of the copper surface be controlled to less than about 40 microinches to eliminate of voids caused by nailheads, reduce negative etchback and to minimize the effect on impedance of the circuits. The inventors have found that the addition of the aliphatic saturated dicarboxylic acid, especially glutaric acid, to a traditional microetching solution allows the etch of the surface to be controlled to less than 25 microinches. Depending on the concentration of aliphatic dicarboxylic acid in the composition, the etch may even be controlled to less than 15 microinches. In general, the aliphatic saturated dicarboxylic acid is preferably present in the solution of the invention at a concentration of 1 to 5 grams/liter. Table 1 demonstrates the advantages yielded by adding glutaric acid to a conventional sodium persulfate-based microetching solution.

TABLE 1

Etch using sodium persulfate-based microetching solution containing glutaric acid

|  | Etch (microinches) | Propagation | 2 minute Backlight | Total innerlayer defects |
|---|---|---|---|---|
| Microetchant[1] | 47 | 7/5 | 7.1 | 2% |
| Microetchant + 1 g/l glutaric acid | 23 | 7/7 | 7.4 | 4% |
| Microetchant + 2 g/l glutaric acid | 12 | 7/5 | 5.3 | 2% |

[1]Microetchant contains 120 g/l sodium persulfate, 1–2% sulfuric acid, and 5 g/l copper sulfate crystals A hydrogen peroxide-based microetching solution can also be used. The hydrogen peroxide-based microetching solution generally comprises hydrogen peroxide and acid, preferably inorganic acid such as sulfuric acid. Known peroxide stabilizers may be added. The inventors have surprisingly discovered that the addition of amino tris(methylene phosphonic acid) to the hydrogen peroxide-based microetching solution can suppress the etch very effectively without decreasing the etchant's ability to clean carbon from the metal surfaces. The concentration of the foregoing additive can range from about 20 ppm to about 2 g/l, but is preferably about 50 ppm. A suitable source of the amino tris(methylene phosphonic acid) is available from Solutia, Inc., under the tradename Dequest 2000®. Table 2 demonstrates the advantages yielded by adding amino tris(methylene phosphonic acid) to a conventional hydrogen peroxide-based microetching solution.

TABLE 2

Etch using hydrogen peroxide-based microetching solution containing amino tris(methylene phosphonic acid)

|  | Etch (microinches) | Inner layer defects (%) |
|---|---|---|
| Microetchant[2] | 61 | 20.0% |
| Microetchant + 40 g/l citric acid | 31 | 13.5% |
| Microetchant + 0.1 ml/l Dequest ® 2000 | 20 | 15.5% |

[2]Microetchant contains hydrogen peroxide, sulfuric acid, stabilizer, and copper sulfate.

The inventors have also found that the addition of a stable surfactant such as perfluoroctane sulfoneacide tetraethyl ammonium salt, available from Bayer AG under the tradename Bayowet® 248R, to a hydrogen peroxide-based microetching solution can greatly reduce the surface tension of the solution and improve microvia cleaning. Furthermore, the addition of the perfluoroctane sulfoneacide tetraethyl ammonium salt helps to clean carbon from the microvias. The inventors have found that solutions containing about 50 to about 2500 ppm, preferably about 365 to about 375 ppm of the perfluoroctane sulfoneacide tetraethyl ammonium salt yield beneficial results. Furthermore, the combination of amino tri(methylene phosphonic acid) and perfluoroctane sulfoneacide tetraethyl ammonium salt in the hydrogen peroxide-based etching solution of the invention has been found to improve dry film adhesion without causing lock-on. Table 3 demonstrates the improved microvia cleaning effect achieved by adding perfluoroctane sulfoneacide tetraethyl ammonium salt to the conventional hydrogen-peroxide based microetchant.

TABLE 3

Percentage of clean microvias using hydrogen peroxide-based microetching solution containing Bayowet ® 248R

|  | Surface Tension (mN/m) | Clean vias (%) |
|---|---|---|
| Microetchant[3] | 72 | 1.25% |
| Microetchant + 372 ppm Bayowet ® 248R | 18 | 14.1% |

[3]Microetchant contains hydrogen peroxide, sulfuric acid, stabilizer, and copper sulfate.

What is claimed is:

1. A process for the manufacture of a printed circuit board comprising conductors comprised of copper and non-conducting material, said process comprising:
   (a) contacting said printed circuit board with a dispersion comprising carbon particles; and
   (b) contacting the printed circuit board with an aqueous microetchant comprising:
      (i.) sodium persulfate;
      (ii.) acid; and
      (iii.) one or more aliphatic saturated dicarboxylic acids; such that the carbon particles are substantially removed from the conductors but the carbon particles substantially remain as a coating on the non-conducting material.

2. The process according to claim 1, wherein the aliphatic saturated dicarboxylic acid is selected from the group consisting of malonic acid, succinic acid, and glutaric acid.

3. The process according to claim 2, wherein the aliphatic saturated dicarboxylic acid comprises glutaric acid.

4. The process of claim 1, wherein the etch of the surface is controlled to less than about 40 microinches.

5. The process according to claim 1, wherein the etch of the surface is controlled to less than about 25 microinches.

6. The process according to claim 1 wherein the etch of the surface is controlled to less than about 15 microinches.

7. A method of microetching a metal substrate by contacting the substrate with an aqueous composition consisting essentially of:
   (a) sodium persulfate;
   (b) an acid; and
   (c) an aliphatic saturated dicarboxylic acid; and
   (d) copper sulfate.

8. The method according to claim 7, wherein the aliphatic saturated dicarboxylic acid is selected from the group consisting of malonic acid, succinic acid, and glutaric acid.

9. The method according to claim 7, wherein the aliphatic saturated dicarboxylic acid comprises glutaric acid.

10. The method according to claim 7, wherein the aliphatic saturated dicarboxylic acid is present in said composition in an amount of about 1 to 5 grams/liter.

11. The method of claim 7, wherein the surface is etched to a depth of less than about 40 microinches.

12. The method according to claim 7, wherein the surface is etched to a depth of less than about 25 microinches.

13. The method according to claim 7, wherein the surface is etched to a depth of less than about 15 microinches.

* * * * *